(12) United States Patent
Zhou et al.

(10) Patent No.: US 11,540,400 B2
(45) Date of Patent: Dec. 27, 2022

(54) DISPLAY DEVICE

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Xiuhe Zhou, Beijing (CN); Jun Li, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/280,775

(22) PCT Filed: Jul. 23, 2020

(86) PCT No.: PCT/CN2020/103747
§ 371 (c)(1),
(2) Date: Mar. 26, 2021

(87) PCT Pub. No.: WO2021/047299
PCT Pub. Date: Mar. 18, 2021

(65) Prior Publication Data
US 2021/0345499 A1 Nov. 4, 2021

(30) Foreign Application Priority Data
Sep. 11, 2019 (CN) .......................... 201910860534.4

(51) Int. Cl.
*H05K 5/02* (2006.01)
*H05K 5/00* (2006.01)
(Continued)

(52) U.S. Cl.
CPC ............ *H05K 5/0017* (2013.01); *F16M 13/02* (2013.01); *H05K 5/0204* (2013.01); *H05K 5/04* (2013.01)

(58) Field of Classification Search
CPC ...... H05K 5/0017; H05K 5/04; H05K 5/0204; F16M 13/02
See application file for complete search history.

(56) References Cited

U.S. PATENT DOCUMENTS 6,559,829 B1 *  5/2003  Matsuo .................... G09F 7/18
                                                                   345/905
6,587,082 B1 *  7/2003  Moore .................. G06F 3/1423
                                                                   361/679.48
(Continued)

FOREIGN PATENT DOCUMENTS

CN        201531723 U      7/2010
CN        201731252 U      2/2011
(Continued)

OTHER PUBLICATIONS

First Office Action for Chinese Application No. 201910860534.4, dated Feb. 20, 2021, 12 Pages.
(Continued)

*Primary Examiner* — Abhishek M Rathod
*Assistant Examiner* — Keith DePew
(74) *Attorney, Agent, or Firm* — Brooks Kushman P.C.

(57) ABSTRACT

The present disclosure provides a display device including a display apparatus. The display apparatus includes: a side frame; at least two display modules installed on the side frame and including a first display module and a second display module, display screens of the display modules facing a same direction; and a back housing installed on the side frame. An accommodation space is formed between the back housing and the side frame, the first display module is disposed in the accommodation space, a first surface of the (Continued)

back housing away from the display screen and a second surface of the second display module away from the display screen are located on a same plane and form an outer surface of the display apparatus away from the display screen, and the second display module is a display module other than the first display module among the at least two display modules.

13 Claims, 6 Drawing Sheets

(51) Int. Cl.
*F16M 13/02* (2006.01)
*H05K 5/04* (2006.01)

(56) References Cited

U.S. PATENT DOCUMENTS

| | | | | |
|---|---|---|---|---|
| 6,859,219 B1* | 2/2005 | Sall | ............ | G06F 1/1683 |
| | | | | 345/905 |
| 7,397,461 B1* | 7/2008 | Graham | ............ | G06F 1/1601 |
| | | | | 348/789 |
| 7,561,116 B2* | 7/2009 | Westerinen | ............ | G06F 1/1616 |
| | | | | 345/1.3 |
| 9,326,394 B2* | 4/2016 | Lin | ............ | G06F 1/1654 |
| 10,514,722 B1* | 12/2019 | Artwohl | ............ | A47F 3/043 |
| 11,249,579 B2* | 2/2022 | Wolters | ............ | G06F 3/04883 |
| 2004/0150581 A1* | 8/2004 | Westerinen | ............ | G06F 1/1616 |
| | | | | 345/1.3 |
| 2007/0285343 A1* | 12/2007 | Han | ............ | G06F 1/1637 |
| | | | | 345/1.3 |
| 2010/0141589 A1* | 6/2010 | Hoover | ............ | G06F 3/0425 |
| | | | | 345/173 |
| 2013/0192866 A1* | 8/2013 | King | ............ | G06F 1/182 |
| | | | | 174/50 |
| 2015/0116507 A1* | 4/2015 | Sagerian | ............ | H04N 17/004 |
| | | | | 348/189 |
| 2015/0198831 A1* | 7/2015 | Kim | ............ | G02F 1/133308 |
| | | | | 345/1.3 |
| 2018/0084659 A1* | 3/2018 | Pecorino | ............ | G09F 11/10 |
| 2019/0006335 A1* | 1/2019 | Lee | ............ | H01L 27/124 |
| 2021/0294151 A1* | 9/2021 | Rickers | ............ | G02F 1/133514 |

FOREIGN PATENT DOCUMENTS

| | | |
|---|---|---|
| CN | 102620132 A | 8/2012 |
| CN | 205229888 U | 5/2016 |
| CN | 206601915 U | 10/2017 |
| CN | 108825977 A | 11/2018 |
| CN | 208673638 U | 3/2019 |
| CN | 208889222 U | 5/2019 |
| CN | 208903599 U | 5/2019 |
| CN | 110113550 A | 8/2019 |
| CN | 110544438 A | 12/2019 |
| DE | 102011076673 A1 | 12/2012 |

OTHER PUBLICATIONS

International Search Report and Written Opinion for Application No. PCT/CN2020/103747 dated Oct. 21, 2020, 9 Pages.
1$^{st}$ Chinese Office Action, English Translation.
International Search Report and Written Opinion, English Translation.
CN102620132A, English Abstract and Machine Translation.
CN108825977A, English Abstract and Machine Translation.
CN110544438A, English Abstract and Machine Translation.
CN201531723U, English Abstract and Machine Translation.
CN201731252U, English Abstract and Machine Translation.
CN205229888U, English Abstract and Machine Translation.
CN206601915U, English Abstract and Machine Translation.
CN208673638U, English Abstract and Machine Translation.
CN208889222U, English Abstract and Machine Translation.
CN208903599U, English Abstract and Machine Translation.
DE102011076673A1, English Abstract and Machine Translation.
Second Office Action for Chinese Application No. 201910860534.4, dated Oct. 9, 2021, 10 Pages.

* cited by examiner

DISPLAY DEVICE

CROSS-REFERENCE TO RELATED APPLICATION APPLICATIONS

This application is the U.S. national phase of PCT Application No. PCT/CN2020/103747 filed on Jul. 23, 2020, which claims priority to Chinese Patent Application No. 201910860534.4 filed on Sep. 11, 2019, which are incorporated herein by reference in their entireties.

TECHNICAL FIELD

The present disclosure relates to the field of display technology, in particular to a display device.

BACKGROUND

With the development of the display technology, there is such a trend to provide a large-scale and ultra-thin display. A conference machine provided with two display screens (or even more than two display screens) is one of the widely-used displays. The conference machine is usually hung to save space.

Compared with a display with a single display screen, an internal structure of the conference machine with multiple display screens is more complicated. In order to facilitate the installation of various internal components, a back housing has various structures and shapes. When the back housing is installed on a wall, a distance between the display screen and the wall is relatively large, so the conference machine occupies a large space, and thereby an appearance may be adversely affected.

SUMMARY

The present disclosure provides in some embodiments a display device, including a display apparatus. The display apparatus includes: a side frame; at least two display modules installed on the side frame, light-exiting sides of display screens of the display modules facing a same direction, and the at least two display modules including a first display module and a second display module; and a back housing installed on the side frame. An accommodation space is formed between the back housing and the side frame, and the first display module is disposed in the accommodation space, the back housing is provided with a first surface, the first surface is a surface away from the display screen of each display module, the second display module is provided with a second surface, the second surface is a surface of the second display module away from the display screen, the first surface and the second surface are located on a same plane, a surface formed by the first surface and the second surface is an outer surface of the display apparatus away from the display screen, and the second display module is a display module other than the first display module among the at least two display modules.

The present disclosure further provides in some embodiments a display device, including a display apparatus. The display apparatus includes: a side frame; at least two display modules installed on the side frame, light-exiting sides of display screens of the display modules facing a same direction; and a back housing installed on the side frame. An accommodation space is formed between the back housing and the side frame, and a first display module of the at least two display modules is disposed in the accommodation space, a first surface of the back housing away from the display screen and a second surface of a second display module of the at least two display modules away from the display screen are located on a same plane, a surface formed by the first surface and the second surface is an outer surface of the display apparatus away from the display screen, and the second display module is a display module other than the first display module among the at least two display modules.

In a possible embodiment of the present disclosure, the display device further includes a wall-hanging body including an arrangement space, a first positioning plane is formed in the arrangement space, the display apparatus is disposed in the arrangement space, and at least a part of the first surface and/or the second surface is attached to the first positioning plane.

In a possible embodiment of the present disclosure, a second positioning plane and a third positioning plane each perpendicular to the first positioning plane are formed in the arrangement space, the second positioning plane and the third positioning plane are perpendicular to each other, and the second positioning plane and the third positioning plane are attached to two adjacent side surfaces of the side frame respectively.

In a possible embodiment of the present disclosure, the wall-hanging body includes a first wall-hanging body, and the first wall-hanging body includes a first portion in a strip-like shape, and a second portion bent toward a first side surface of the first portion. The second portion is arranged at one end of the first portion, the first side surface forms the first positioning plane, and a space between a surface of the second portion facing the first side surface and the first side surface forms the arrangement space.

In a possible embodiment of the present disclosure, the wall-hanging body further includes a second wall-hanging body separated from the first wall-hanging body, and the second wall-hanging body includes a third portion in a strip-like shape, and a fourth portion and a fifth portion bent toward a second side surface of the third portion. The fourth portion and the fifth portion are disposed at opposite ends of the third portion respectively, the second side surface forms the first positioning plane, a space among a surface of the fourth portion facing the second side surface, a surface of the fifth portion facing the second side surface and the second side surface forms the arrangement space.

In a possible embodiment of the present disclosure, a slot is formed in the first surface, an end of the first portion away from the second portion is provided with a protrusion adapted to the slot, and the protrusion is disposed in the slot.

In a possible embodiment of the present disclosure, a third side surface of the first portion away from the first side surface is parallel to the first side surface, a fourth side surface of the third portion away from the second side surface is parallel to the second side surface, and a distance between the first side surface and the third side surface is equal to a distance between the second side surface and the fourth side surface.

In a possible embodiment of the present disclosure, the first display module is fixedly coupled to the side frame through a bracket, and a mainboard is disposed between the first display module and the back housing.

In a possible embodiment of the present disclosure, a plate is installed on the module bracket at a side of the first display module away from the display screen, and the mainboard is arranged between the plate and the back housing.

In a possible embodiment of the present disclosure, a first side of the second display module is provided with a Timing Control (T-CON) board, a second side of the second display module adjacent to the first side is provided with a Flexible Flat Cable (FFC) and a SOURCE board, the T-CON board is electrically coupled to the mainboard, and the first side of the second display module is a side close to the first display module.

In a possible embodiment of the present disclosure, the back housing is made of metal, and the second surface of the second display module is arranged on a glass back plate.

In a possible embodiment of the present disclosure, a thickness of the second display module is greater than a thickness of the first display module, and a surface of a display screen of the first display module and a surface of a display screen of the second display module are arranged on a same surface.

In a possible embodiment of the present disclosure, the first display module and the second display module are arranged in the side frame side by side.

In a possible embodiment of the present disclosure, the display apparatus further includes a tempered glass substrate disposed on the side frame and attached to the surface of the display screen of the first display module and the surface of the display screen of the second display module, and a surface of the tempered glass substrate is provided with a processed layer.

In a possible embodiment of the present disclosure, the display apparatus further includes an infrared touch circuit board disposed in the side frame, and the infrared touch circuit board includes an infrared sensor exposed through the side frame.

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, a back housing of a display apparatus with at least two display screens has a complicated structure, and a large space is occupied by the display apparatus and thereby an appearance may be adversely affected when it is hung on a wall. In order to solve the above problems while providing an ultra-thin display apparatus the present disclosure provides in some embodiments a display device. A surface (second surface) of a second display module of a display apparatus away from a display screen is on a same plane as a surface (first surface) of a back housing of the display apparatus away from the display screen, and the surface of the second display module away from the display screen forms a part of a back surface of the display apparatus, so as to provide an ultra-thin display apparatus. In addition, an outer surface (back surface) of the display apparatus away from the display screen is a flat surface, so as to reduce the space occupied by the display apparatus when it is hung on a wall. Hence, through the above-mentioned arrangement, it is able to solve the above-mentioned problems while providing an ultra-thin display apparatus.

The present disclosure provides in some embodiments a display device, which includes a display apparatus. The display apparatus includes: a side frame; at least two display modules installed on the side frame, light-exiting sides of display screens of the display modules facing a same direction, and the at least two display modules including a first display module and a second display module; and a back housing installed on the side frame. An accommodation space is formed between the back housing and the side frame, and the first display module is disposed in the accommodation space, the back housing is provided with a first surface, the first surface is a surface away from the display screen of each display module, the second display module is provided with a second surface, the second surface is a surface of the second display module away from the display screen, the first surface and the second surface are located on a same plane, a surface formed by the first surface and the second surface is an outer surface of the display apparatus away from the display screen, and the second display module is a display module other than the first display module among the at least two display modules.

Figure 1:
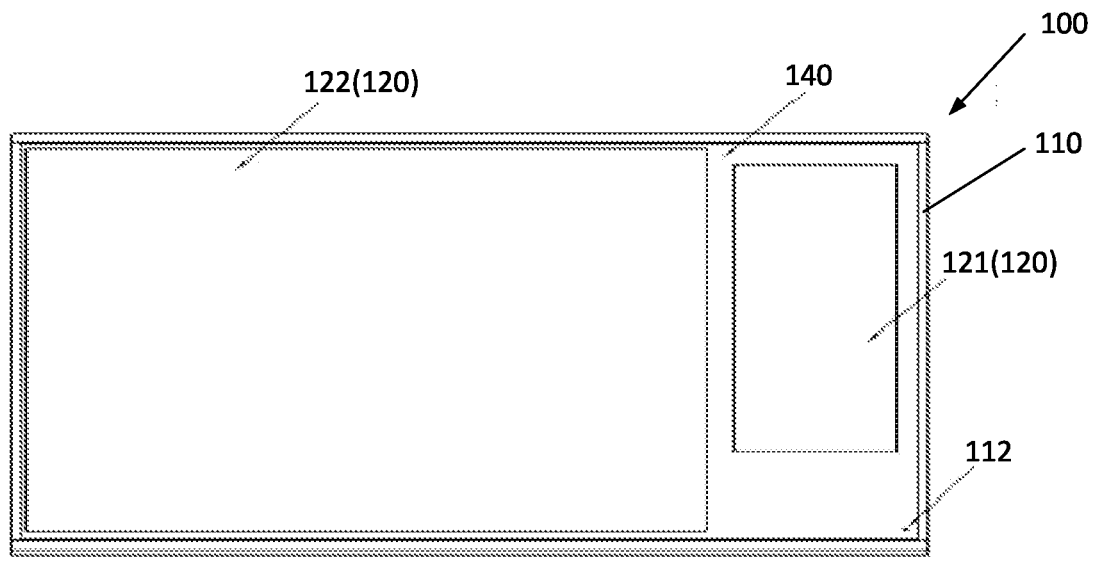
FIG. 1 is a front view of a display device according to one embodiment of the present disclosure.
Figure 2:
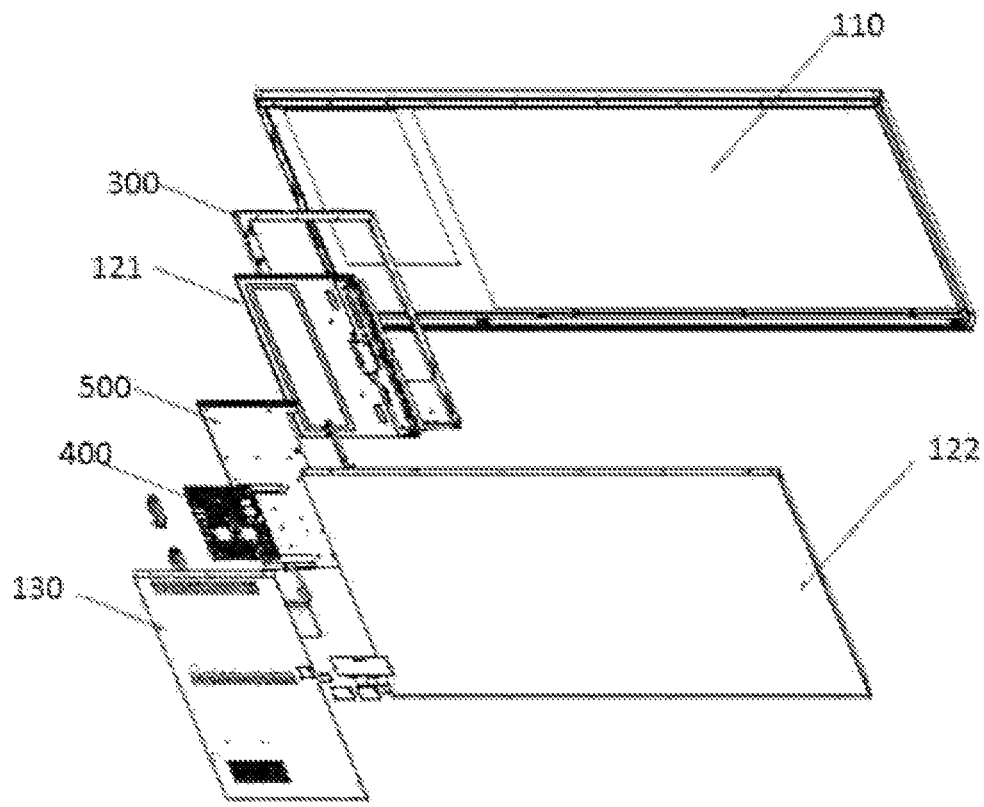
FIG. 2 is an exploded view of a display apparatus in the display device according to one embodiment of the present disclosure.
Figure 3:
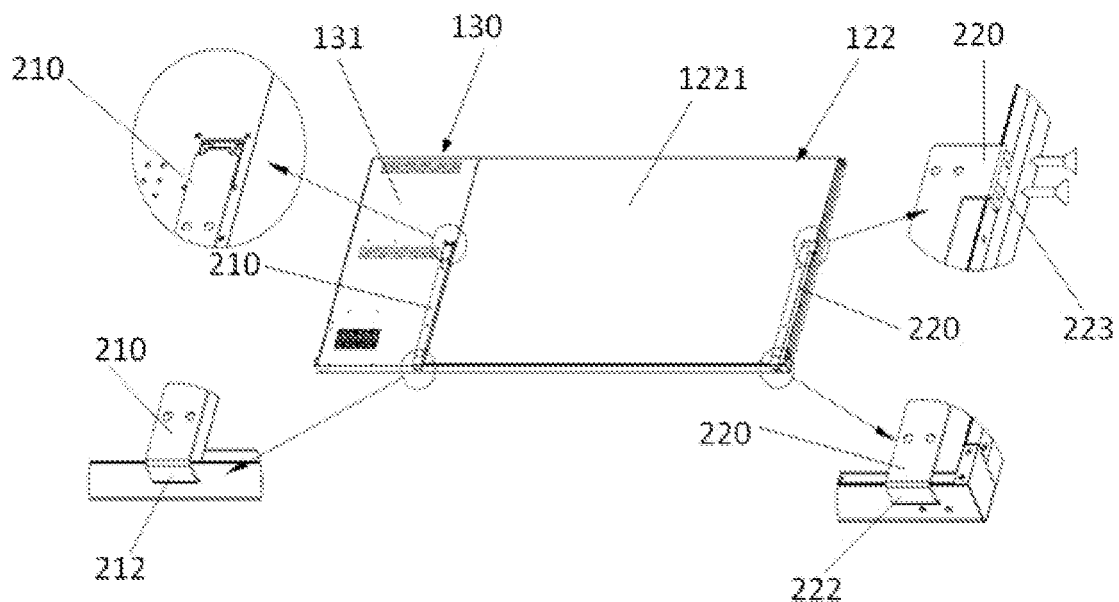
FIG. 3 is a back view of the display device according to one embodiment of the disclosure.

As shown in FIGS. 1, 2 and 3, the display device in the embodiments of the present disclosure includes a display apparatus 100. The display apparatus 100 includes a housing and a frame, the frame includes a front frame, also called as a side frame, and the housing is also called as a back housing.

As shown in FIGS. 1, 2 and 3, the display apparatus 100 includes a side frame 110 and at least two display modules 120 installed on the side frame 110. Light-exiting sides of display screens of the display modules 120 face a same direction, and each display module includes a display panel.

The display apparatus 100 further includes a back housing 130 installed on the side frame 110. An accommodation space is formed between the back housing 130 and the side frame 110, and a first display module 121 of the at least two display module 120 is disposed in the accommodation space. A first surface 131 of the back housing 130 away from the display screen and a second surface 1221 of a second display module 122 of the at least two display module 120 away from the display screen are arranged on a same plane, and a surface formed by the first surface 131 and the second surface 1221 is an outer surface of the display apparatus 100 away from the display screen.

The second display module 122 is a display module other than the first display module 121 among the at least two display modules 120.

In a possible embodiment of the present disclosure, as shown in FIG. 1, the side frame 110 may be made of an aluminum alloy, and include four edges and a body connecting each edge. The body may be provided with via holes corresponding to the display modules 120 respectively, and a display screen of each display module 120 may be exposed through the corresponding via-hole in the side frame 110.

In the embodiments of the present disclosure, the light-exiting sides of the display screens of the display modules 120 may face a same direction. In a possible embodiment of the present disclosure, on the side frame 110, the display screens of the display modules 120 may be arranged on a same plane. It should be appreciated that, the display screens of the at least two display modules 120 may not be limited to being arranged on the same plane. For example, the body of the side frame 110 may also include ladder-shaped surfaces parallel to each other, and via holes for exposing the display screens of the display modules 120 may be formed in the ladder-shaped surfaces at different levels, so that the display screens of the at least two display modules 120 may be parallel to each other and arranged at different levels relative to the side frame 110.

It should be appreciated that, in the display apparatus 100, a surface provided with the display screen is a front surface, and a surface away from the display screen is a back surface.

As shown in FIGS. 2 and 3, in the embodiments of the present disclosure, the display apparatus 100 may include two display modules 120, i.e., the first display module 121 and the second display module 122. It should be appreciated that, the quantity of the display modules 120 shall not be limited to two.

Furthermore, as shown in FIGS. 2 3, the first display module 121 and the second display module 122 of the display apparatus 100 may be disposed at one side of the side frame 110 and correspond to the via holes in the side frame 110 respectively. The back housing 130 may be arranged on a side of the first display module 121 away from the display screen. The back housing 130 may be installed on the side frame 110, and the accommodation space may be formed between the back housing 130 and the side frame 110 to accommodate mainboards and electronic components on the display apparatus 100 and the first display module 121.

In addition, in the embodiments of the present disclosure, a substrate of the second display module 122 away from the display screen may be exposed from the display apparatus 100, that is, a surface (the second surface 1221) of the substrate of the second display module 122 away from the display screen may form a part of the back surface of the display apparatus 100. The second surface 1221 and the first surface 131 of the back housing 130 away from the display screen may be combined to form the back surface of the display apparatus 100. In the embodiments of the present disclosure, the first surface 131 and the second surface 1221 may be located on a same plane, so as to reduce a distance between the back surface of the display apparatus 100 and a wall as possible when the display apparatus is hung on the wall, thereby to improve the appearance of the display apparatus 100.

It should be appreciated that, the display module 120 may be one of a liquid crystal display module and an Organic Light-Emitting Diode (OLED) display module. For any type of display module 120, it should be appreciated that, components of the display module 120 may be formed on a glass substrate, and a substrate of the display module 120 away from the display screen is usually the glass substrate.

In the embodiments of the present disclosure, the second surface 1221 of the second display module 122 may be arranged on the glass back plate. In a possible embodiment of the present disclosure, the back housing 130 may be made of metal. In this regard, a part of the back surface of the display apparatus 100 may be made of glass, and the other part may be made of metal.

Figure 4:
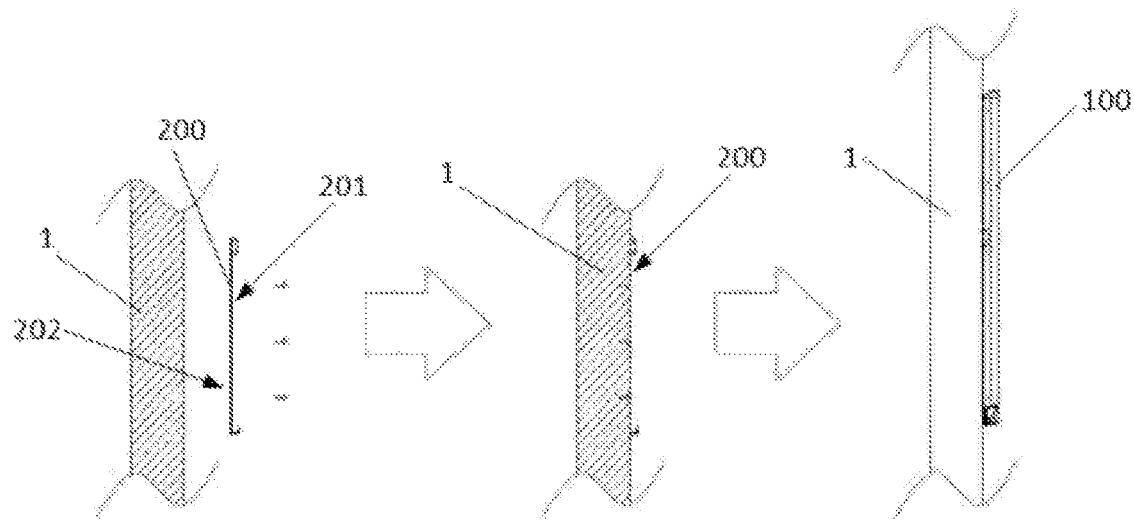
FIG. 4 is a schematic view showing an assembling process of the display apparatus and a wall-hanging body according to one embodiment of the present disclosure.

In some embodiments of the present disclosure, as shown in FIGS. 3 and 4, the display device may further include a wall-hanging body 200 which includes an arrangement space, and a first positioning plane 201 may be formed in the arrangement space. The display apparatus 100 may be arranged in the arrangement space, and at least a part of the first surface 131 and/or second surface 1221 may be attached to the first positioning plane 201.

The display apparatus 100 may be hung on the wall through the wall-hanging body 200. When installed on the wall-hanging body 200, the display apparatus 100 may be disposed in the arrangement space, and at least a part of the first surface 131 and/or the second surface 1221 of the back surface may be attached to the first positioning plane 201, so as to stably install the display apparatus 100 on the wall-hanging body 200. In addition, when the display apparatus 100 is attached to the wall-hanging body 200 on a surface-to-surface basis, so it is able to improve appearance of the display apparatus 100.

Further, in a possible embodiment of the present disclosure, the wall-hanging body 200 may also include an installation surface 202 away from the first positioning plane 201. As shown in FIG. 4, the installation surface 202 may be a flat surface parallel to the first positioning plane 201. When the wall-hanging body 200 is installed on the wall, the installation surface 202 may be fixedly attached to a wall body 1, so as to ensure that a distance between the back surface of the display apparatus 100 and the wall is just a distance between the first positioning plane 201 and the installation surface 202, thereby to improve the appearance of the display apparatus 100.

As shown in FIG. 4, in a possible embodiment of the present disclosure, an installation hole may be formed in the wall-hanging body 200, and the wall-hanging body 200 may be fixed to the wall body 1 through rivets. In a possible embodiment of the present disclosure, the distance between the installation surface 202 of the wall-hanging body 200 and the first positioning plane 201 may be equal to a thickness of the wall-hanging body 200, i.e., the wall-hanging body 200 may be of a sheet-like structure, as shown in FIG. 4, so as to reduce the distance between the display apparatus 100 and the wall body 1 as possible and enable the display apparatus 100 to appear as though it is directly hung on the wall body 1, thereby to improve the appearance of the display apparatus 100.

In a possible embodiment of the present disclosure, in order to ensure the stability of the display apparatus 100 on the wall-hanging body 200, a second positioning plane and a third positioning plane perpendicular to the first positioning plane 201 may be formed in the arrangement space of the wall-hanging body 200, and the second positioning plane and the third positioning plane may be perpendicular to each other. The second positioning plane and the third positioning plane may be attached to two adjacent side surfaces of the side frame respectively.

Figure 5:
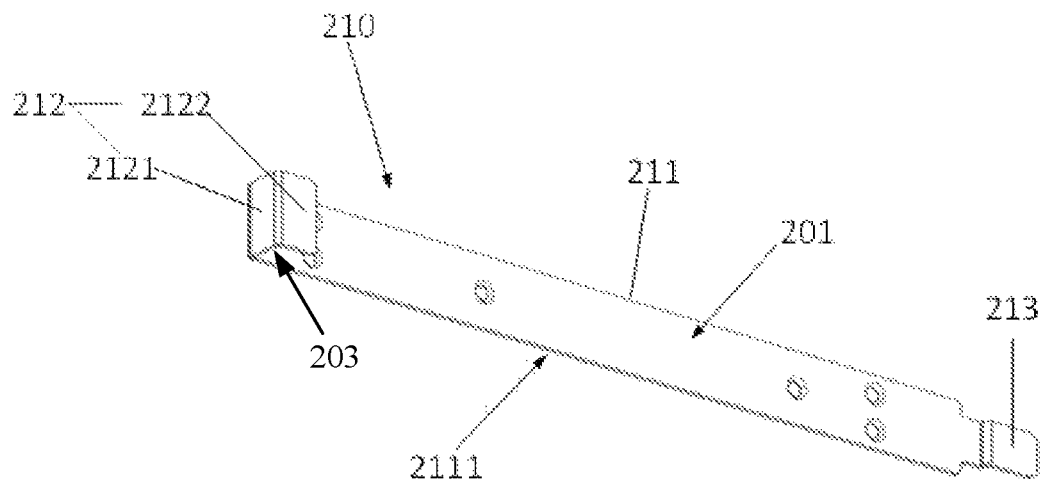
FIG. 5 is a solid view of a first wall-hanging body according to one embodiment of the disclosure.

In a possible embodiment of the present disclosure, the wall-hanging body 200 may include a first wall-hanging body 210, as shown in FIG. 5. The first wall-hanging body 210 may include a first portion 211 in a strip-like shape and a second portion 212 bent toward a first side surface of the first portion 211 and arranged at one end of the first portion 211. The first side surface may form the first positioning plane 201, and a space between a surface of the second portion 212 facing the first side surface and the first side surface may form the arrangement space.

Figure 6:
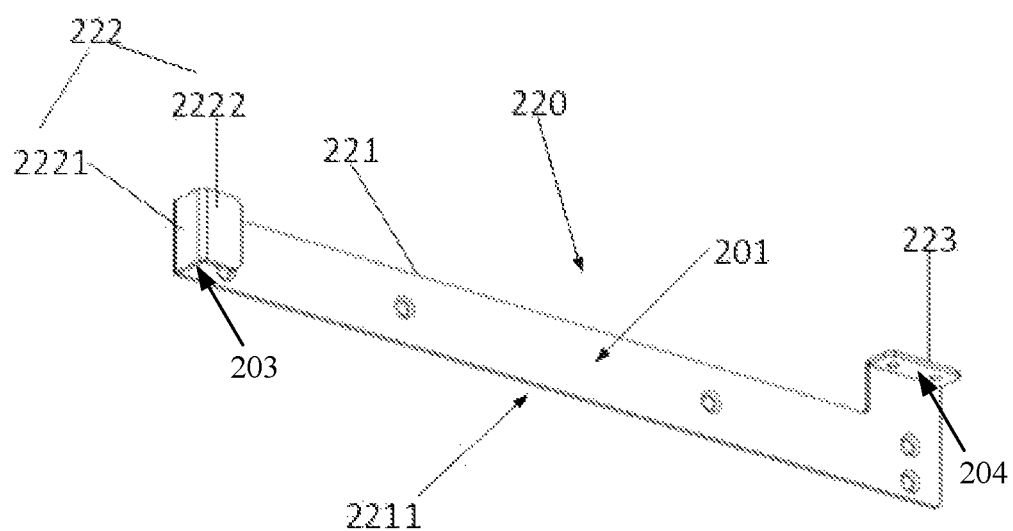
FIG. 6 is a solid view of a second wall-hanging body according to one embodiment of the disclosure.

In a possible embodiment of the present disclosure, as shown in FIG. 6, the wall-hanging body 200 may further include a second wall-hanging body 220 separated from the first wall-hanging body 210. The second wall-hanging body 220 may include a third portion 221 in a strip-like shape, and a fourth portion 222 and a fifth portion 223 bent toward a second side surface of the third portion 221.

The fourth portion 222 and the fifth portion 223 may be disposed at opposite ends of the third portion 221 respectively. The second side surface may form the first positioning plane 201, and a space among a surface of the fourth portion 222 facing the second side surface 201, a surface of the fifth portion 223 facing the second side surface and the second side surface may form the arrangement space.

In a possible embodiment of the present disclosure, the second portion 212 of the first wall-hanging body 210 may include a first bent portion 2121 perpendicular to the first portion 211 and a second bent portion 2122 parallel to the first portion 211. The first portion 211, the first bent portion 2121 and the second bent portion 2122 may be coupled in sequence. The fourth portion 222 of the second wall-hanging body 220 may include a third bent portion 2221 perpendicular to the third portion 221 and a fourth bent portion 2222 parallel to the third portion 221, and the third portion 221, the third bent portion 2221 and the fourth bent portion 2222 may be coupled in sequence.

Further, as shown in FIGS. 3 and 5, in the embodiments of the present disclosure, the back housing 130 may be provided with a slot in the first surface 131, an end of the first portion 211 of the first wall-hanging body 210 away from the second portion 212 may be provided with a protrusion 213 adapted to the slot and arranged in the slot. In a possible embodiment of the present disclosure, the protrusion 213 may be bent relative to the first portion 211 and parallel to the first portion 211, but it may be arranged on a plane different from the first portion 211.

As shown in FIGS. 3 6, the fifth portion 223 of the second wall-hanging body 220 may be disposed at an end away from the fourth portion 222, bent toward the second side surface of the third portion 221, and configured to be attached to one side surface of the side frame 110 of the display apparatus 100.

Based on the above-mentioned first wall-hanging body 210 and second wall-hanging body 220, as shown in FIG. 3, when the display apparatus 100 is assembled with the wall-hanging body 200, the first wall-hanging body 210 and the second wall-hanging body 220 may be separated from each other, so as to support different parts of the display apparatus 100.

Specifically, the first portion 211 of the first wall-hanging body 210 and the third portion 221 of the second wall-hanging body 220 may be arranged in such a manner as to be perpendicular to the ground. The protrusion 213 of the first wall-hanging body 210 may be arranged at an upper end relative to the second portion 212, and the fifth portion 223 of the second wall-hanging body 220 may be arranged at an upper end relative to the fourth portion 222.

The first side surface of the first wall-hanging body 210 and the second side surface of the second wall-hanging body 220 may be arranged on a same plane, and the first side surface and the second side surface may form the first positioning plane 201. In addition, a surface of the first bent portion 2121 of the first wall-hanging body 210 facing the first side surface and a surface of the third bent portion 2221 of the second wall-hanging body 220 facing the second side surface, which form the second positioning plane 203, may be arranged on a same plane, such as a horizontal plane. The second positioning plane 203 perpendicular to the first positioning plane 201 may be used to support the display apparatus 100 arranged vertically, i.e., it may be attached to a lower side surface of the side frame 110 of the display apparatus 100 (the side surface that is located at the lowermost end and arranged horizontally). In this regard, the first bent portion 2121 and the second bent portion 2122, as well as the third bent portion 2221 and the fourth bent portion 2222, may form supporting spaces, and the display apparatus 100 may be disposed in the supporting spaces. Through the supporting spaces, it is able to position a lower side surface of the display apparatus 100.

In addition, the protrusion 213 of the first wall-hanging body 210 may be disposed in the slot in the first surface 131 of the back housing 130, and the fifth portion 223 of the second wall-hanging body 220 may be fixedly coupled to a vertical side surface of the display apparatus 100, so as to fix the display apparatus 100 onto the first wall-hanging body 210 and the second wall-hanging body 220. In a possible embodiment of the present disclosure, the fifth portion 223 of the second wall-hanging body 220 may be coupled to the side frame 110 of the display apparatus 100 through rivets. A surface of the fifth portion 223 facing the second side surface may form the third positioning plane 204 perpendicular to the first positioning plane and the second positioning plane, so as to firmly install the display apparatus 100 on the wall-hanging body 200 in different directions.

Based on the above, a space defined by the first portion 211 and the second portion 212 of the first wall-hanging body 210 as well as the third portion 221, the fourth portion 222 and the fifth portion 223 of the second wall-hanging body 220 may be just the accommodation space for placing therein the display apparatus 100, so it is able to install the display apparatus 100 on the wall-hanging body 200 firmly.

In a possible embodiment of the present disclosure, as shown in FIGS. 4, 5 and 6, a third side surface 2111 of the first portion 211 away from the first side surface may be parallel to the first side surface, a fourth side surface 2211 of the third portion 221 away from the second side surface may be parallel to the second side surface, and a distance between the first side surface and the third side surface 2111 may be equal to a distance between the second side surface and the fourth side surface 2211.

The third side surface 2111 and the fourth side surface 2211 may form the installation surface 202 of the wall-hanging body 200 parallel to the first positioning plane 201. When the wall-hanging body 200 is installed on the wall, the installation surface 202 may be fixedly attached to the wall body, so as to enable a distance between the back surface of the display apparatus 100 and the wall to be equal to a distance between the first positioning plane 201 and the installation surface 202, thereby to improve the appearance of the display apparatus 100.

Figure 7:
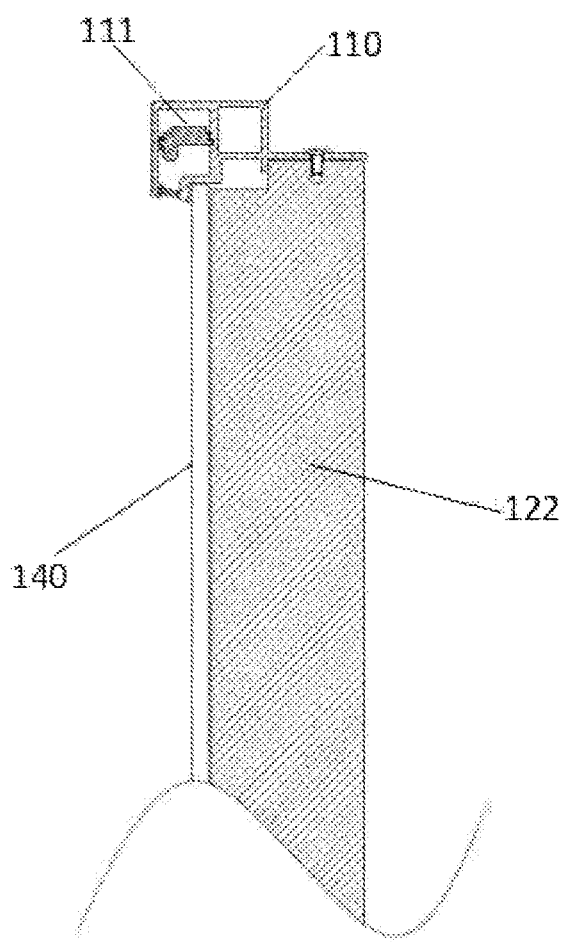
FIG. 7 is a schematic view showing a second display module according to one embodiment of the present disclosure.

In a possible embodiment of the present disclosure, as shown in FIGS. 1 and 2, a size of the display screen of the second display module 122 may be larger than a size of the display screen of the first display module 121. In order to minimize a thickness of the display apparatus 100, in a possible embodiment of the present disclosure, the first display module 121 and the second display module 122 may be both liquid crystal display modules, the first display module 121 may include an edge-type backlight source, and the second display module 122 may include a direct-type backlight source. In this regard, a thickness of the second display module 122 may be greater than a thickness of the first display module 121, and electronic elements of the display apparatus 100 may be disposed between the first display module 121 and the back housing 130. As shown in FIGS. 2 and 7, in a possible embodiment of the present disclosure, the second display module 122 may directly fixedly coupled to the side frame 110. In the embodiments of the present disclosure, the second display module 122 may be coupled to the side frame 110 through bolts.

Figure 8:
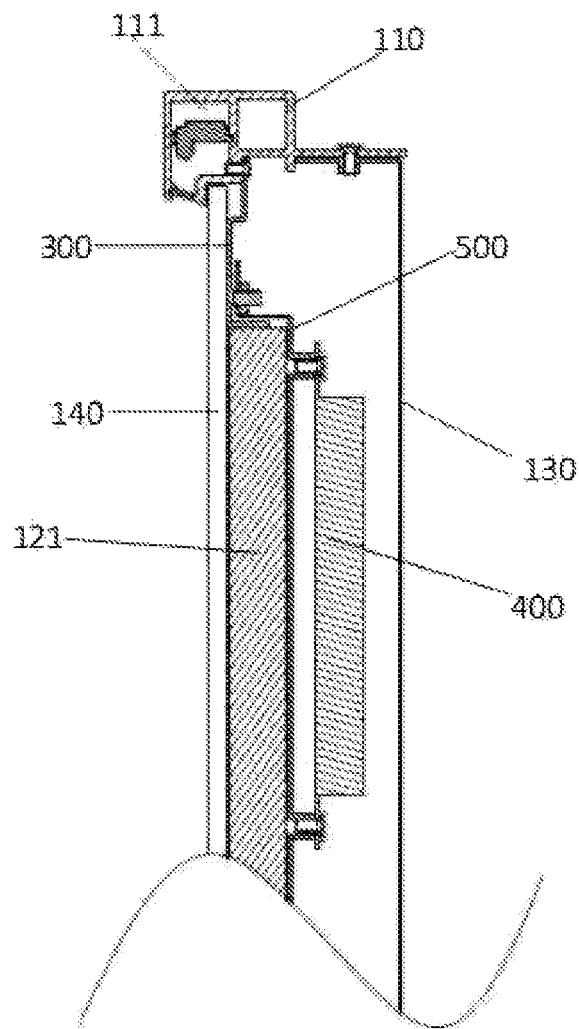
FIG. 8 is a schematic view showing a first display module according to one embodiment of the present disclosure.

As shown in FIGS. 2 and 8, in the embodiments of the present disclosure, the first display module 121 may be fixedly coupled to the side frame 110 through a bracket 300, and a mainboard 400 may be arranged between the first display module 121 and the back housing 130.

In a possible embodiment of the present disclosure, on the module bracket 300, a plate 500 may be installed at a side of the first display module 121 away from the display screen, and the mainboard 400 may be disposed between the plate 500 and the back housing 130. In a possible embodiment of the present disclosure, the plate 500 and the module bracket 300 may be fixedly coupled to each other through bolts, and the back housing 130 and the side frame 110 may be fixedly coupled to each other through bolts.

In the embodiments of the present disclosure, main electronic elements of the display apparatus 100, such as a power supply board, a speaker and a wireless network card, may all be arranged on the mainboard 400 and between the plate 500 and the back housing 130.

Based on the above structure, when the thickness of the first display module 121 is smaller than that of the second display module 122, the back housing 130 on the side of the first display module 121 away from the light-exiting side and the surface of the second display module 122 away from the display screen may be located on the same plane. In this regard, a space may be formed between the first display module 121 and the back housing 130 for the electronic elements of the display apparatus 100, so as to provide the ultra-thin display apparatus 100.

Figure 9:
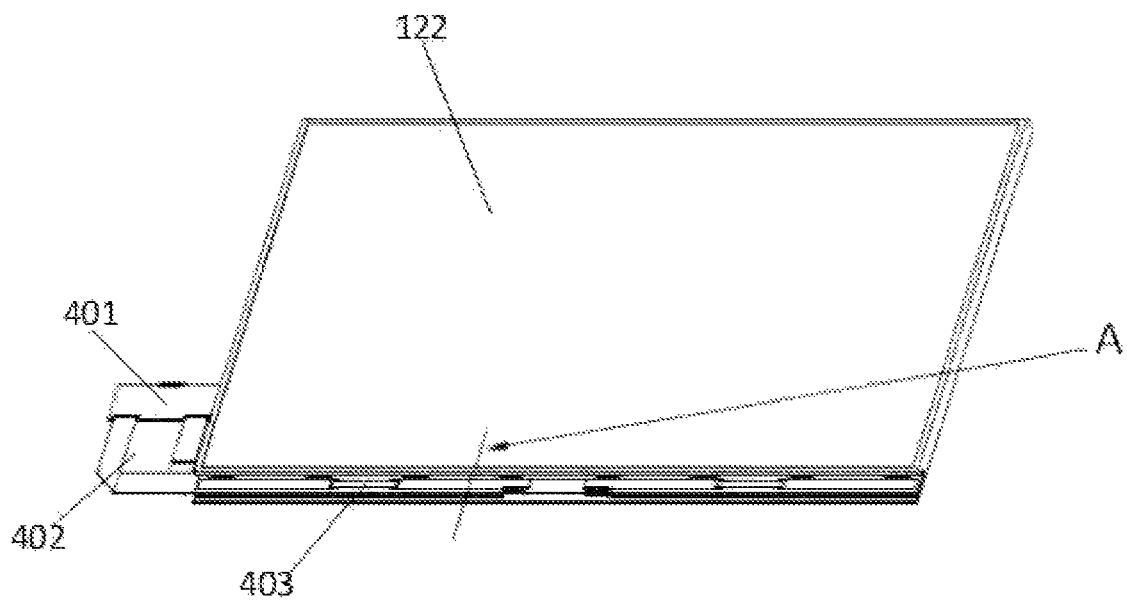
FIG. 9 is a schematic view showing connection lines on the second display module according to one embodiment of the present disclosure.
Figure 10:
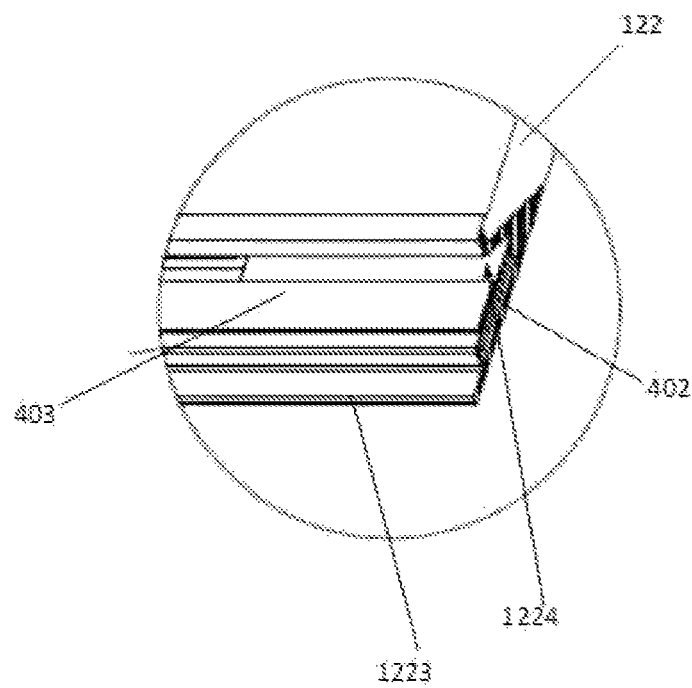
FIG. 10 is an enlarged view of A in FIG. 9.

In the embodiments of the present disclosure, as shown in FIGS. 9 and 10, a first side of the second display module 122 may be provided with a T-CON board 401, and a second side of the second display module 122 adjacent to the first side may be provided with an FFC 402 and a SOURCE board 403.

The T-CON board 401 may be electrically coupled to the mainboard 400, and the first side of the second display module may be a side close to the first display module 121.

To be specific, as shown in FIG. 10, along the second side of the second display module 122, an extension body 1223 may be provided on a lower substrate of the second display module 122 with respect to a display region. The extension body 1223 may be provided with a hollow cavity for receiving the FFC cable 402. The FFC cable 402 may extend in the hollow cavity to the first side of the second display module 122, that is, to the side where the T-CON board 401 is located. In addition, on an outer surface of the extension body 1223, the SOURCE board 403 may be provided along a length direction of the extension body 1223.

Through the above arrangement, it is able to effectively reduce a space occupied by connection lines on the display apparatus 100. In addition, on the extension body 1223, the SOURCE board 403 and the T-CON board 401 may be arranged at different layers, so as to effectively reduce a side margin of the display apparatus.

In a possible embodiment of the present disclosure, along the length direction of the extension body 1223, a groove 1224 may be formed in the second display module 122, and optionally, the groove 1224 may have a V-shaped cross section. Through the groove 1224, it is able to increase a space for receiving the SOURCE board 403 without increasing a width of the extension body 1223.

In a possible embodiment of the present disclosure, as shown in FIGS. 7 and 8, the display apparatus 100 may further include a tempered glass substrate 140 arranged on the side frame 110 and on the light-exiting side of the display screen. A surface of the tempered glass substrate 140 may include a processed layer, so that when no image is displayed by the first display module 121 and the second display module 122, the tempered glass substrate 140 may become a whiteboard on which a user may write with a chalk stick or a whiteboard marker, so as to enable the display apparatus 100 to achieve more functions.

In a possible embodiment of the present disclosure, as shown in FIGS. 1, 7 and 8, the side frame 110 may be provided with a closed space 111 in a direction facing the display screen, for receiving an infrared touch circuit board. An infrared sensor 112 may be arranged on the infrared touch circuit board, exposed at a front surface of the side frame 110, and configured to receive an infrared signal.

In the embodiments of the present disclosure, the specific structure of the display device has been described when the display apparatus includes the first display module and the second display module. It should be appreciated that, the display apparatus may include more than two display modules. Based on the above layout principle, when the display apparatus includes two or more display modules, the back housing may be arranged on a side of each of at least a part of the display modules (including one or at least two display modules, which may be collectively referred to as the first display module) away from the display screen. Surfaces of the other part of the display modules (including one or at least two display modules, which may be collectively referred to as the second display module) away from a substrate of the display screen may form a part of a back surface of the display apparatus, and a surface of the back housing away from the display screen may form the other part of the back surface. The two may be arranged on the same plane to form the back surface of the display apparatus.

Through the above-mentioned structure, it is able to, while providing the ultra-thin display device with at least two display screens, solve the problem in the related art where the back housing of the display apparatus has a complicated structure, and a large space is occupied by the display apparatus and thereby the appearance is adversely affected when it is hung on the wall.

The above are some embodiments of the present disclosure. The above embodiments are for illustrative purposes only, but the present disclosure is not limited thereto. Obviously, a person skilled in the art may make further modifications and improvements without departing from the principle of the present disclosure, and these modifications and improvements shall also fall within the scope of the present disclosure.

What is claimed is:

1. A display device, comprising a display apparatus, wherein the display apparatus comprises:
   a side frame;
   at least two display modules installed on the side frame, light-exiting sides of display screens of the display modules facing a same direction, and the at least two display modules comprising a first display module and a second display module; and
   a back housing installed on the side frame,
   wherein an accommodation space is formed between the back housing and the side frame, and the first display module is disposed in the accommodation space, the back housing is provided with a first surface, the first surface is a surface away from the display screen of each display module, the second display module is provided with a second surface, the second surface is a surface of the second display module away from the display screen, the first surface and the second surface are located on a same plane, a surface formed by the first surface and the second surface is an outer surface of the display apparatus away from the display screen, and the second display module is a display module other than the first display module among the at least two display modules;

wherein the display apparatus further comprises a bracket, wherein the first display module is fixedly coupled to the side frame through the bracket, and a mainboard is disposed between the first display module and the back housing; and wherein a first side of the second display module is provided with a Timing Control (T-CON) board, a second side of the second display module adjacent to the first side is provided with a Flexible Flat Cable (FFC) and a SOURCE board, the T-CON board is electrically coupled to the mainboard, and the first side of the second display module is a side close to the first display module.

2. The display device according to claim 1, further comprising a wall-hanging body comprising an arrangement space, wherein a first positioning plane is formed in the arrangement space, the display apparatus is disposed in the arrangement space, and at least a part of the first surface and/or the second surface is attached to the first positioning plane.

3. The display device according to claim 2, wherein a second positioning plane and a third positioning plane each perpendicular to the first positioning plane are formed in the arrangement space, the second positioning plane and the third positioning plane are perpendicular to each other, and the second positioning plane and the third positioning plane are attached to two adjacent side surfaces of the side frame respectively.

4. The display device according to claim 2, wherein the wall-hanging body comprises a first wall-hanging body, and the first wall-hanging body comprises a first portion in a strip-like shape and a second portion bent toward a first side surface of the first portion, wherein the second portion is arranged at one end of the first portion, the first side surface forms the first positioning plane, and a space between a surface of the second portion facing the first side surface and the first side surface forms the arrangement space.

5. The display device according to claim 4, wherein the wall-hanging body further comprises a second wall-hanging body separated from the first wall-hanging body, and the second wall-hanging body comprises a third portion in a strip-like shape, and a fourth portion and a fifth portion bent toward a second side surface of the third portion, wherein the fourth portion and the fifth portion are disposed at opposite ends of the third portion respectively, the second side surface forms the first positioning plane, a space among a surface of the fourth portion facing the second side surface, a surface of the fifth portion facing the second side surface and the second side surface forms the arrangement space.

6. The display device according to claim 5, wherein a third side surface of the first portion away from the first side surface is parallel to the first side surface, a fourth side surface of the third portion away from the second side surface is parallel to the second side surface, and a distance between the first side surface and the third side surface is equal to a distance between the second side surface and the fourth side surface.

7. The display device according to claim 4, wherein a slot is formed in the first surface, an end of the first portion away from the second portion is provided with a protrusion adapted to the slot, and the protrusion is disposed in the slot.

8. The display device according to claim 1, wherein the display apparatus further comprises a plate installed on the bracket at a side of the first display module away from the display screen, and the mainboard is arranged between the plate and the back housing.

9. The display device according to claim 1, wherein the back housing is made of metal, and the second surface of the second display module is arranged on a glass back plate.

10. The display device according to claim 1, wherein a thickness of the second display module is greater than a thickness of the first display module, and a surface of a display screen of the first display module and a surface of a display screen of the second display module are arranged on a same surface.

11. The display device according to claim 10, wherein the first display module and the second display module are arranged in the side frame side by side.

12. The display device according to claim 10, wherein the display apparatus further comprises a tempered glass substrate disposed on the side frame and attached to the surface of the display screen of the first display module and the surface of the display screen of the second display module, and a surface of the tempered glass substrate is provided with a processed layer.

13. The display device according to claim 1, wherein the display apparatus further comprises an infrared touch circuit board disposed in the side frame, and the infrared touch circuit board comprises an infrared sensor exposed through the side frame.

* * * * *